US009090817B2

(12) United States Patent
Jang et al.

(10) Patent No.: US 9,090,817 B2
(45) Date of Patent: *Jul. 28, 2015

(54) QUANTUM DOT PHOSPHOR FOR LIGHT EMITTING DIODE AND METHOD OF PREPARING THE SAME

(71) Applicant: SAMSUNG ELECTRONICS CO., LTD, Suwon-si, Gyeonggi-do (KR)

(72) Inventors: Eun Joo Jang, Daejeon-si (KR); Mi Yang Kim, Gwangju-si (KR); Hyung Kun Kim, Suwon-si (KR); Shin Ae Jun, Seongnam-si (KR); Yong Wan Jin, Seoul (KR); Seong Jae Choi, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/181,500

(22) Filed: Feb. 14, 2014

(65) Prior Publication Data

US 2014/0158979 A1 Jun. 12, 2014

Related U.S. Application Data

(63) Continuation of application No. 13/194,359, filed on Jul. 29, 2011, now Pat. No. 8,664,637, which is a continuation of application No. 11/225,089, filed on Sep. 14, 2005, now abandoned.

(30) Foreign Application Priority Data

Jan. 20, 2005 (KR) .................. 10-2005-0005445

(51) Int. Cl.
*H01L 33/06* (2010.01)
*C09K 11/02* (2006.01)

(Continued)

(52) U.S. Cl.
CPC ............... *C09K 11/025* (2013.01); *B82Y 10/00* (2013.01); *C09K 11/02* (2013.01); *C09K 11/565* (2013.01);

(Continued)

(58) Field of Classification Search
CPC ............................... H01L 33/20; H01L 33/32
USPC ........................................................ 257/79
See application file for complete search history.

(56) References Cited

U.S. PATENT DOCUMENTS 5,643,674 A 7/1997 Bruno et al.
6,156,233 A 12/2000 Yoshida et al.

(Continued)

FOREIGN PATENT DOCUMENTS

JP 08504871 A 5/1996
JP 200144126 A 5/2000

(Continued)

OTHER PUBLICATIONS

English Translation of JP Office Action No. 2006010312 dated Dec. 20, 2011, "Notification of Reason for Refusal".

(Continued)

*Primary Examiner* — Matthew Reames
(74) *Attorney, Agent, or Firm* — Cantor Colburn LLP

(57) ABSTRACT

Disclosed herein is a quantum dot phosphor for light emitting diodes, which includes quantum dots and a solid substrate on which the quantum dots are supported. Also, a method of preparing the quantum dot phosphor is provided. Since the quantum dot phosphor of the current invention is composed of the quantum dots supported on the solid substrate, the quantum dots do not aggregate when dispensing a paste obtained by mixing the quantum dots with a paste resin for use in packaging of a light emitting diode. Thereby, a light emitting diode able to maintain excellent light emitting efficiency can be manufactured.

10 Claims, 4 Drawing Sheets

(51) Int. Cl.
*B82Y 10/00* (2011.01)
*C09K 11/56* (2006.01)
*C09K 11/88* (2006.01)
*H01L 29/12* (2006.01)
*H01L 33/50* (2010.01)

(52) U.S. Cl.
CPC ............ *C09K 11/883* (2013.01); *H01L 29/127* (2013.01); *H01L 33/06* (2013.01); *H01L 33/502* (2013.01)

(56) References Cited

U.S. PATENT DOCUMENTS

| | | |
|---|---|---|
| 6,277,766 B1 | 8/2001 | Ayers |
| 6,501,091 B1 | 12/2002 | Bawendi et al. |
| 6,726,992 B1 | 4/2004 | Yadav et al. |
| 6,803,719 B1 | 10/2004 | Miller et al. |
| 6,982,046 B2 | 1/2006 | Srivastava et al. |
| 2002/0017650 A1 | 2/2002 | Nikolaev et al. |
| 2002/0018632 A1 | 2/2002 | Pelka |
| 2002/0158267 A1 | 10/2002 | Kelsey |
| 2002/0163483 A1 | 11/2002 | Crist |
| 2003/0003300 A1 | 1/2003 | Korgel et al. |
| 2003/0080341 A1 | 5/2003 | Sakano et al. |
| 2003/0113709 A1 | 6/2003 | Alivisatos et al. |
| 2003/0127659 A1 | 7/2003 | Bawendi et al. |
| 2003/0148544 A1 | 8/2003 | Nie et al. |
| 2004/0067355 A1 | 4/2004 | Yadav et al. |
| 2005/0052878 A1 | 3/2005 | Yamada et al. |
| 2005/0073239 A1 | 4/2005 | Srivastava et al. |
| 2005/0287691 A1 | 12/2005 | Chen et al. |
| 2006/0001352 A1* | 1/2006 | Maruta et al. ................. 313/486 |
| 2006/0019098 A1 | 1/2006 | Chan et al. |
| 2007/0161043 A1 | 7/2007 | Nie et al. |

FOREIGN PATENT DOCUMENTS

| | | |
|---|---|---|
| JP | 2003246981 A | 9/2003 |
| JP | 2004071908 A | 3/2004 |
| JP | 2005108843 A | 4/2005 |
| WO | 03003015 A2 | 1/2003 |
| WO | WO2004042834 * | 5/2004 |

OTHER PUBLICATIONS

Eunjoo Jang, "High quality CdSeS nanocrystals synthesized by facile single injection process and their electroluminescence", ChemComm, 2003, pp. 2964-2965.

Victor M. Ustinov et al., "InAs/InGaAsN quantum dots emitting at 1.55 um grown by molecular beam epitaxy" Journal of Crystal Growth, 2003, pp. 388-391.

Office Action—JP with English Translation of Application No. 2006-010312 dated Jul. 10, 2012.

Japanese Office Action with English Translation of Application No. 2006010312 dated Dec. 2011.

Korean Office Action with English Translation for Application No. 10-2005-0005445 dated Jul. 31, 2006.

Temer S. Ahmadi et al., "Low-temperature synthesis of pure and Mn-doped willemite phosphor ($Zn_2SiO_4$:Mn) in aqueous medium," Materials Research Bulletin, 2000, pp. 1869-1879.

Office Action—U.S. Appl. No. 12/939,613 dated Feb. 29, 2012.
Office Action—U.S. Appl. No. 12/939,613 dated Jun. 29, 2012.
Office Action—U.S. Appl. No. 13/194,359 dated Jun. 28, 2012.

* cited by examiner

QUANTUM DOT PHOSPHOR FOR LIGHT EMITTING DIODE AND METHOD OF PREPARING THE SAME

CROSS-REFERENCE TO RELATED APPLICATIONS

This application is a continuing application of U.S. application Ser. No. 13/194,359, filed on Jul. 29, 2011, which is a continuing application of U.S. application Ser. No. 11/225,089, filed on Sep. 14, 2009, which claims priority to Korean Patent Application No. 10-2005-0005445, filed on Jan. 20, 2005, and all the benefits accruing therefrom under 35 U.S.C. §119, the contents of which in its entirety are herein incorporated by reference.

BACKGROUND OF THE INVENTION

1. Field of the Invention

The present invention relates, generally, to a quantum dot phosphor for light emitting diodes and a method of preparing the same, and more particularly, to a quantum dot phosphor for light emitting diodes, which includes quantum dots, and a solid substrate on which the quantum dots are supported.

2. Description of the Related Art

In general, quantum dots are a nanosized semiconductor material exhibiting quantum confinement effects. When the quantum dots absorb light from an excitation source and reach an excited energy state, the quantum dots emit energy corresponding to the energy band gap thereof. As such, since the energy band gap of the quantum dots may be controlled by adjusting the size or composition of the quantum dots, energy having various wavelengths may be used.

To synthesize nanocrystals, methods of preparing quantum dots have been attempted using vapor deposition processes, such as MOCVD (Metal Organic Chemical Vapor Deposition) or MBE (Molecular Beam Epitaxy). In addition, a chemical wet process including adding a precursor to an organic solvent to grow crystals has been rapidly developed. In the chemical wet process, when the crystals are grown, the organic solvent is naturally situated on the surface of the quantum dot crystals and thus functions as a dispersant to control the growth of the crystals. Therefore, the chemical wet process may be more easily and inexpensively performed, compared to vapor deposition processes such as MOCVD or MBE, thus uniformly controlling the size and shape of the nanocrystals.

U.S. Pat. No. 6,501,091 discloses a light emitting diode using quantum dots dispersed in a paste matrix as a phosphor. In particular, the above patent describes a method of preparing a polymer having dispersed quantum dots for use in manufacturing a light emitting diode, which includes mixing a monomer, which has high affinity to an organic ligand substituted on the surface of the quantum dots, with the quantum dots in the presence of a small amount of a catalyst, to obtain a mixture, which is then dispensed and then heated. However, in conventional processes of manufacturing a light emitting diode, a monomer having high affinity to the organic ligand of the quantum dots is not used, and also, whether the properties of the polymer are suitable for use in a diode may be unconfirmed. That is, in order to apply the quantum dots to a light emitting diode, the use of a mixture comprising the quantum dots and the paste resin serving as a paste of a conventional phosphor is preferable in view of process stability and reliability. However, in the case where the quantum dots are mixed with the paste resin, the quantum dots are difficult to disperse well in the resin due to low affinity to the resin, and thus, may aggregate as shown in FIG. 1, resulting in reduced light emitting efficiency of the quantum dots.

SUMMARY OF THE INVENTION

Accordingly, the present invention has been made keeping in mind the above problems occurring in the related art, and an object of the present invention is to provide a light emitting diode, in which quantum dots do not aggregate and are dispersed well upon dispensing a phosphor paste obtained by mixing quantum dots supported on a solid substrate with a paste resin for use in packaging of a light emitting diode, thus exhibiting excellent light emitting efficiency.

In order to accomplish the above object, according to a first embodiment of the present invention, there is provided a quantum dot phosphor, including quantum dots and a solid substrate on which the quantum dots are supported.

According to a second embodiment of the present invention, there is provided a method of preparing the quantum dot phosphor, including dispersing quantum dots in a dispersion solvent, mixing the dispersed quantum dots with a solid substrate, and drying the mixture to remove the dispersion solvent.

According to a third embodiment of the present invention, there is provided a light emitting diode, including the above quantum dot phosphor, a paste resin to mix with the quantum dot phosphor, an epoxy resin for lamp molding to surround the mixture, and a light source.

According to a fourth embodiment of the present invention, there is provided a method of manufacturing the light emitting diode, including mixing the quantum dot phosphor prepared by the above method with the paste resin, dispensing the mixture on a light emitting diode, and curing the dispensed mixture.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Hereinafter, a detailed description will be given of the present invention, with reference to the appended drawings.

Figure 1:
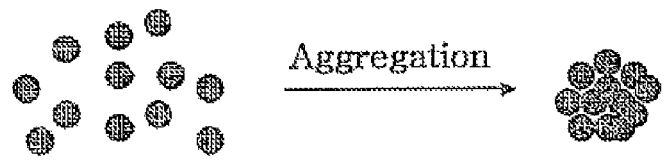
FIG. 1 is a schematic view showing the aggregated quantum dots, according to conventional techniques.
Figure 2:
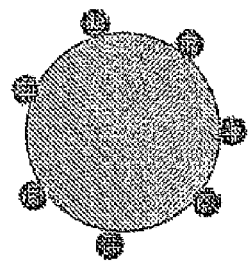
FIG. 2 is a schematic view showing the quantum dots supported on a solid substrate, according to the present invention.

FIG. 2 is a schematic view showing the cross-section of quantum dots supported on a solid substrate, according to the present invention. As shown in FIG. 2, the quantum dots are broadly distributed and supported on a substrate without aggregating. Generally, in cases where quantum dots are mixed with a paste resin, the quantum dots are not efficiently dispersed in the resin due to their low affinity to the resin, and thus, the quantum dots aggregate with each other, resulting in decreased light emitting efficiency of the quantum dots.

Therefore, the present invention is characterized in that the quantum dots are supported on a solid substrate, as seen in FIG. 2, so that they do not aggregate and are efficiently dispersed. That is, quantum dots having a size of nm are synthesized, dispersed in a dispersion solvent, and mixed with the solid substrate having a size of $\mu m$ to prepare a mixture, which then is dried. Thereby, the quantum dots do not aggregate and are supported on the surface of the substrate due to the attraction to the surface of the substrate, and thus, may be efficiently dispersed. Hence, the quantum dots can maintain their light emitting efficiency when mixed with the paste resin for use in manufacturing a light emitting diode.

In the present invention, the quantum dot is selected from the group consisting of Group II-VI compound semiconductor nanocrystals such as CdS, CdSe, CdTe, ZnS, ZnSe, ZnTe, HgS, HgSe or HgTe, Group III-V compound semiconductor nanocrystals such as GaN, GaP, GaAs, AlN, AlP, AlAs, InN, InP or InAs, and mixtures thereof. In the present invention, the mixture is selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe and HgZnSTe, or is selected from the group consisting of GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. As such, the crystal structure of the above mixture may be partially divided and present in the same particles, or may be present in the form of alloys.

In the quantum dot phosphor for light emitting diodes of the present invention, the solid substrate functions to hold the quantum dots to increase the light emitting efficiency. Specifically, the solid substrate includes i) metal oxide, a polymer, or a metal salt, ii) an inorganic phosphor, or iii) mixtures thereof. That is, material i) functions to increase the dispersability of the quantum dots to maintain the light emitting efficiency, and material ii) functions to increase the dispersability of the quantum dots and also to increase the overall efficiency of the light emitting diode by using the light emitting properties of the inorganic phosphor itself.

Specifically, material i) includes, for example, metal oxide selected from the group consisting of $SiO_2$, $TiO_2$, $Al_2O_3$ and mixtures thereof, a polymer selected from the group consisting of polystyrene, polyimide, polyacrylate, polycarbonate and polyimidazole, and a metal salt selected from the group consisting of KBr, NaBr, KI, KCl and NaCl.

In addition, material ii) includes, for example, an inorganic phosphor selected from the group consisting of ZnS:Ag, ZnS:Cu, ZnS:Mn, ZnS:Cu, Al, (Zn,Cd)S:Cu, (Zn,Cd)S:Ag, (Zn,Cd)S:Cu, Al, ZnS:Cu,Au, Al, ZnS:Ag,Cu,Ga,Cl, $Y_2O_2S$:Eu, ZnS:Ag,Al, ZnO:Zn, $BaMgAl_{10}O_{17}$:Eu2+, $(Sr,Ca,Ba,Mg)_{10}(PO_4)_6Cl_2$:Eu, $Sr_{10}(PO_4)_6Cl_2$:Eu, (Ba,Sr,Eu) (Mg,Mn)$Al_{10}O_{17}$, (Ba,Eu)$MgAl_{10}O_{17}$, $YVO_4$:Eu, and mixtures thereof.

The quantum dot phosphor of the present invention may emit light of various wavelengths. Specifically, a) when the quantum dots are mixed, wavelengths thereof may also be mixed, emitting various wavelengths. In addition, b) when the inorganic phosphor is used as a substrate, wavelengths of the quantum dots may be mixed with the wavelength of the inorganic phosphor, emitting various wavelengths. In addition, c) when different kinds of quantum dots are supported on the inorganic phosphor, mixed wavelengths may be emitted from the quantum dots, and also, may be further mixed with the wavelength of the inorganic phosphor, emitting various wavelengths. In addition, d) when the quantum dots are supported on various inorganic phosphors, the wavelengths of the quantum dots and the various inorganic phosphors may be mixed together, emitting various wavelengths. In addition, e) when various quantum dots are mixed with various inorganic phosphors, various wavelengths may be mixed and thus emitted.

Further, the present invention provides a method of preparing the quantum dot phosphor, comprising dispersing quantum dots in a dispersion solvent, mixing the dispersed quantum dots with a solid substrate, to prepare a mixture, and drying the mixture to remove the dispersion solvent from the mixture.

The method of synthesizing the quantum dots used in the present invention is not limited to the above method, and includes all the known techniques. Below, the method of preparing the quantum dots is described using a chemical wet synthetic process (solution process).

To synthesize the nanosized quantum dots using a chemical wet synthetic process, a surfactant is added to an appropriate solvent in an inert atmosphere such as nitrogen or argon while controlling the kind and concentration of the surfactant, and the reaction temperature required to grow the crystal structure is maintained. Then, the precursor of quantum dots is added to the reaction solution, and a predetermined reaction time is maintained to control the size of the quantum dots, after which the reaction is completed. Subsequently, the temperature is decreased, and the resultant material is removed from the solution.

The solvent used for the preparation method of the present invention is selected from the group consisting of alkylphosphines having 6 to 22 carbons, alkylphosphine oxides having 6 to 22 carbons, alkylamines having 6 to 22 carbons, alkanes having 6 to 22 carbons, alkenes having 6 to 22 carbons, and mixtures thereof.

In the preparation method of the present invention, the reaction temperature is in the range of 25 to 400° C., and preferably, 180 to 360° C., to easily grow the crystals and assure the stability of the solvent.

In the preparation method of the present invention, the reaction time is in the range of 1 sec to 4 hr, and preferably, 10 sec to 3 hr.

Since the quantum dots prepared using a chemical wet synthetic process are dispersed in the colloidal state in the solvent, they are removed from the solvent using a centrifuge. The quantum dots thus separated are dispersed in an appropriate dispersion solvent and mixed with a solid substrate. While the dispersion solvent is gradually evaporated at room temperature, the quantum dots and the solid substrate are well mixed, thereby obtaining the quantum dots supported on the solid substrate.

As such, the dispersion solvent used includes chloroform, toluene, octane, heptane, hexane, pentane, dimethylchloride, tetrahydrofuran, methanol, ethanol, propanol, butanol, and mixtures thereof.

After the quantum dots supported on the substrate are prepared, they are dried in an oven at 20 to 200° C. for 0.5 to 8 hr to remove the dispersion solvent, thus synthesizing the quantum dot phosphor.

Figure 3:
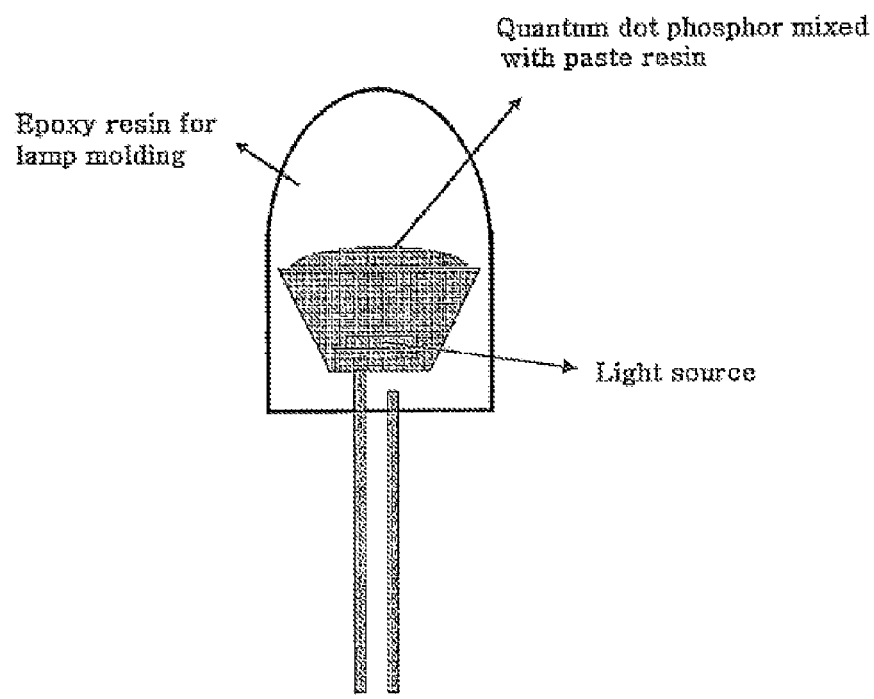
FIG. 3 is a schematic view showing the light emitting diode manufactured according to the present invention.

Further, the present invention provides a light emitting diode using the quantum dot phosphor. That is, the light emitting diode of the present invention includes the quantum dot phosphor, the paste resin to mix with the quantum dot phosphor, an epoxy resin for lamp molding to surround the mixture, and a light source, as shown in FIG. 3.

The paste resin is a material which does not absorb light of a wavelength emitted from the light source of the diode. Specifically, the resin is exemplified by epoxys, silicones, acryl based polymers, glass, carbonate based polymers, or mixtures thereof.

The quantum dot phosphor mixed with the paste resin may be positioned to closely contact the light source, or positioned to be spaced apart from the light source. When the quantum dot phosphor is positioned in close contact to the light source, heat stability is decreased. Conversely, when the quantum dot phosphor is positioned so as to be spaced apart from the light source, light loss occurs due to the refractive index. The light source emits light of a wavelength ranging from 300 to 470 nm.

Further, the present invention provides a method of manufacturing the light emitting diode by mixing the quantum dot phosphor with the paste resin, to prepare a mixture, which is then dispensed on a chip emitting a UV light source and cured in an oven at 120° C. for first dispensing and curing. Subsequently, in order to form the first dispensed and cured mixture into a lamp shape, an epoxy resin for molding is loaded into a mold, into which the chip, having undergone first dispensing and curing, is dipped, cured again, and then removed from the oven. Finally, the mold is removed, therefore obtaining a lamp shaped light emitting diode using the quantum dot phosphor as a luminant.

A further understanding of the present invention may be obtained in view of the following examples which are set forth to illustrate, but are not to be construed to limit the present invention.

PREPARATIVE EXAMPLE 1

Synthesis of Red Light Emitting Nanocrystals 16 g of trioctylamine (TOA), 0.5 g of oleic acid (OA), and 0.4 mmol cadmium oxide were loaded into a 125 ml flask equipped with a reflux condenser, and then the reaction temperature was increased to about 150° C. while a vacuum state was maintained. In that state, the mixture was stirred at 700 rpm or more to be efficiently mixed. When the reaction temperature reached 150° C., a vacuum atmosphere was converted into a nitrogen atmosphere, and the reaction temperature was increased to 300° C. Separately, Se powders were dissolved in trioctylphosphine (TOP) having 97% purity in a nitrogen atmosphere, to prepare an Se-TOP complex solution having about 0.2 M Se. To the mixture stirring at 300° C., 1 ml of the Se-TOP complex solution was rapidly added, and the reaction occurred for about 4 min. Thereafter, 1 ml of a 0.2 M n-octane thiol in TOA was rapidly added to the reaction mixture, and then the reaction took place for about 30 min. During the reaction, the stirring rate and the nitrogen atmosphere were continuously maintained.

After the completion of the reaction, the temperature of the reaction mixture was decreased to room temperature as soon as possible, after which ethanol as a non-solvent was added to the reaction mixture, followed by centrifuging the reaction solution. The supernatant of the solution was decanted, with the exception of the centrifuged precipitate, and the precipitate was dispersed in toluene.

Figure 4:
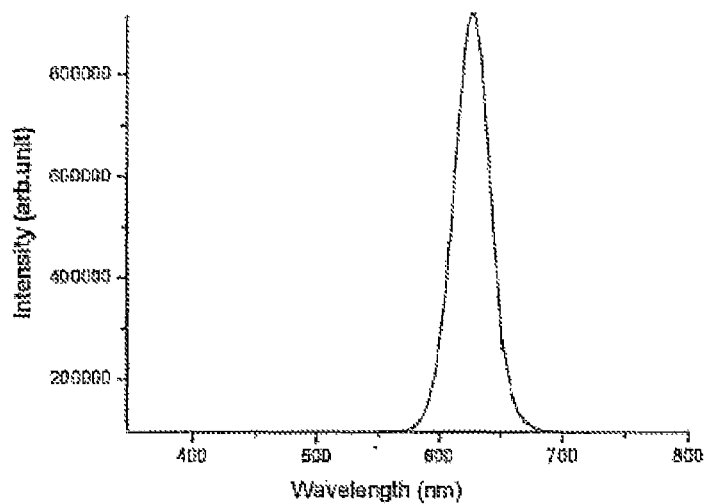
FIG. 4 is a light emitting spectrum of the quantum dots prepared in Preparative Example 1 of the present invention.

The nanocrystals thus obtained had a structure of CdSe (core) and CdS (shell), and emitted red light under a UV lamp at 365 nm. The CdSe/CdS nanocrystals were excited using UV energy of 400 nm, and the light spectrum thereof is shown in FIG. 4. In the drawing, quantum efficiency is confirmed to be about 85%, compared to Rhodamine 6G (organic laser, quantum efficiency 100%).

COMPARATIVE EXAMPLE 1

(1) Preparation of Quantum Dot Phosphor not Supported on Substrate

To 5 ml of a solution of 1 wt % CdSe/CdS nanocrystal synthesized in Preparative Example 1 dispersed in toluene, ethanol as a non-solvent was added. The nanocrystals were precipitated, and dried at room temperature, to prepare a quantum dot phosphor which was not supported on the substrate.

(2) Fabrication of Light Emitting Diode

Figure 5:
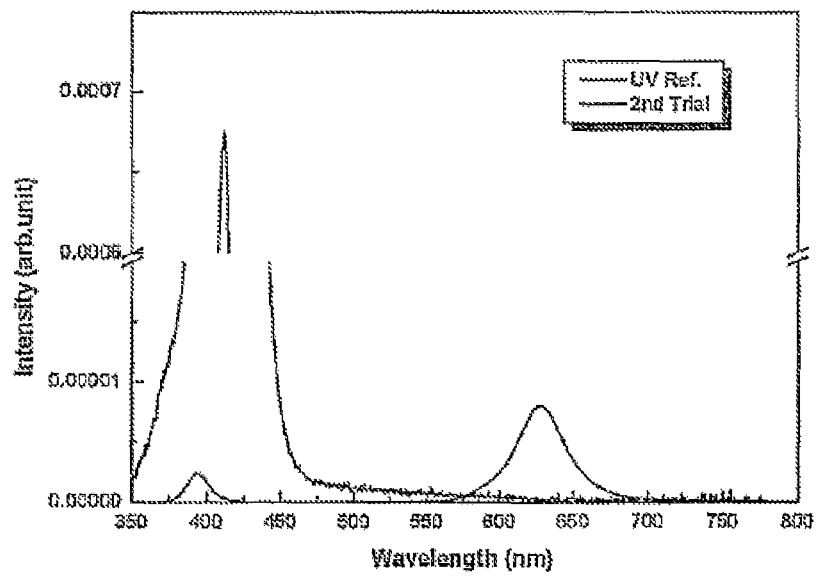
FIG. 5 is a light emitting spectrum of the light emitting diode using the quantum dots manufactured in Comparative Example 1 of the present invention.

The quantum dot phosphor thus prepared was mixed with 2 g of a solution of an epoxy resin and a curing agent mixed at a weight ratio of 1:1, to prepare a mixture solution of nanocrystals and an epoxy resin. The mixture solution was dispensed on a chip emitting a UV light source of 400 nm, and then cured in an oven at 120° C. for 1 hr. To package the first dispensed and cured mixture of nanocrystals and an epoxy resin to a lamp, a solution of an epoxy resin and a curing agent mixed at a weight ratio of 1:1 was loaded into a mold, into which the chip, having undergone first dispensing, was dipped and then cured again in an oven at 120° C. After about 2 hr, the chip was removed from the oven, and subsequently, the mold was removed from the chip, to complete a light emitting diode using CdSe/CdS nanocrystals as a luminant. When current of about 20 mA was applied to the diode thus manufactured, the diode emitted red light. Further, the diode was loaded into an integrating sphere, and measured for light emitting efficiency, which was found to be about 2.6%. The light emitting spectrum is depicted in FIG. 5.

EXAMPLE 1

(1) Preparation of Quantum Dot Phosphor Supported on KBr Substrate 5 ml of a solution of 1 wt % CdSe/CdS nanocrystals synthesized in Preparative Example 1 dispersed in toluene were added to 1 g of KBr powders. While toluene was gradually evaporated at room temperature, the nanocrystals and the powders were well mixed and kneaded. After the solution was dried, the powders were loaded into an oven at 80° C. for 6 hr, to completely dry toluene, thereby preparing a quantum dot phosphor supported on a KBr substrate. The dried KBr powders represented the color of CdSe/CdS nanocrystals, and the nanocrystals were present in the efficiently dispersed state on the KBr substrate.

(2) Fabrication of Light Emitting Diode

Figure 6:
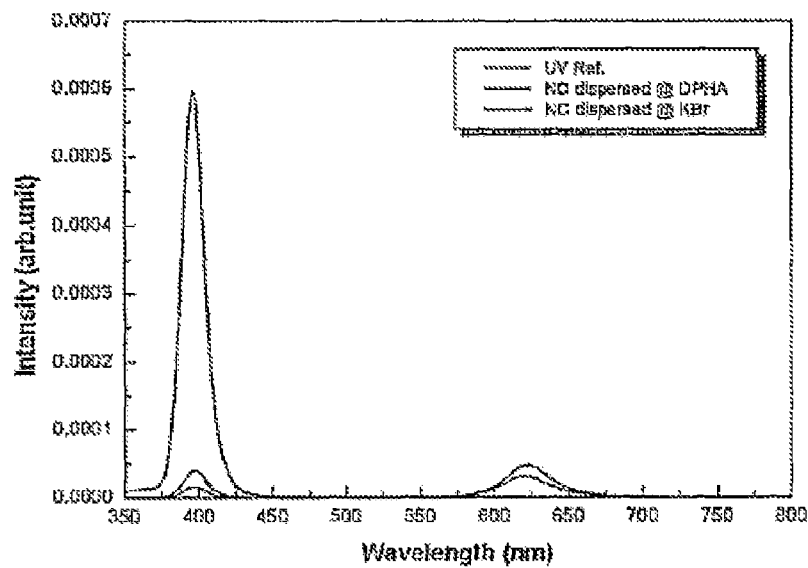
FIG. 6 is a light emitting spectrum of the light emitting diode using the quantum dot phosphor manufactured in Example 1 of the present invention.

The quantum dot phosphor comprising nanocrystals dispersed and supported on KBr powders was mixed with 2 g of a solution of an epoxy resin and a curing agent mixed at a weight ratio of 1:1, to prepare a mixture of powders and an epoxy resin. The mixture was dispensed on a chip emitting a UV light source of 400 nm, and then cured in an oven at 120° C. for 1 hr. To package the first dispensed and cured mixture to a lamp, a solution of an epoxy resin and a curing agent mixed at a weight ratio of 1:1 was loaded into a mold, into which the chip, having undergone first dispensing, was dipped and then cured again in an oven at 120° C. After about 2 hr, the chip was removed from the oven, and subsequently, the mold was removed from the chip, to obtain a light emitting diode using CdSe/CdS nanocrystals dispersed and supported on KBr powders as a luminant. When current of about 20 mA was applied to the diode thus manufactured, the diode emitted red light. Further, the diode was loaded into an integrating sphere, and then measured for light emitting efficiency, which was found to be about 12%. The light emitting spectrum is depicted in FIG. 6.

EXAMPLE 2

(1) Preparation of Quantum Dot Phosphor Supported on PS Bead Substrate 10 ml of 1 wt % plain(hydrophobic)polystyrene microspheres (PS beads) dispersed in an aqueous solution available from Bangs Laboratory were centrifuged and dried. The dried powders were dispersed again in toluene, added with ethanol, centrifuged, and then re-dried, to prepare PS beads without a surfactant. To the PS beads thus separated, 5 ml of a solution of 1 wt % CdSe/CdS nanocrystals synthesized in Preparative Example 1 dispersed in toluene were added. While toluene was gradually evaporated at room temperature, the nanocrystals and the powders were well mixed and kneaded. After the solution was dried, the powders were loaded into an oven at 80° C. for 6 hr, to completely dry toluene, thereby preparing a quantum dot phosphor supported on a PS bead substrate. The dried PS beads represented the color of CdSe/CdS nanocrystals, and the nanocrystals were present in the efficiently dispersed state on the surface of or in the holes of the PS beads.

(2) Fabrication of Light Emitting Diode

Figure 7:
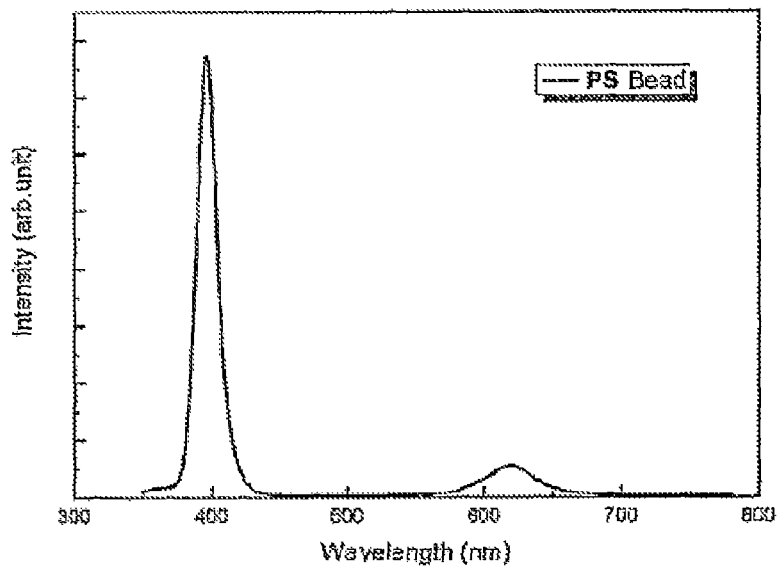
FIG. 7 is a light emitting spectrum of the light emitting diode using the quantum dot phosphor manufactured in Example 2 of the present invention.

The quantum dot phosphor comprising nanocrystals dispersed and supported on or in PS beads was mixed with 2 g of a solution of epoxy resin and curing agent mixed at a weight ratio of 1:1, to prepare a mixture of PS beads and an epoxy resin. The mixture was dispensed on a chip emitting a UV light source of 400 nm, and then cured in an oven at 120° C. for 1 hr. To package the first dispensed and cured mixture to a lamp, a solution of epoxy resin and curing agent mixed at a weight ratio of 1:1 was loaded into a mold, into which the chip, having undergone first dispensing, was dipped and then cured again in an oven at 120° C. After about 2 hr, the chip was removed from the oven, and subsequently, the mold was removed from the chip, to obtain a light emitting diode using CdSe/CdS nanocrystals dispersed and supported on or in PS beads as a luminant. When current of about 20 mA was applied to the diode thus manufactured, the diode emitted red light. Further, the diode was loaded into an integrating sphere, and then measured for light emitting efficiency, which was found to be about 8.5%. The light emitting spectrum is depicted in FIG. 7.

EXAMPLE 3

(1) Preparation of Quantum Dot Phosphor Supported on Inorganic Phosphor 5 ml of a solution of 1 wt % CdSe/CdS nanocrystals synthesized in Preparative Example 1 dispersed in toluene were added to 1 g of LDP-R3 inorganic phosphor((Zn,Cd)S:Ag+ $In_2O_3$, available from Kasei Optonix). While toluene was gradually evaporated at room temperature, the nanocrystals and the phosphor were well mixed and kneaded. After the solution was dried, the phosphor was loaded into an oven at 80° C. for 6 hr, to completely dry toluene, thereby preparing a sample 1. Separately, another phosphor having nanocrystals dispersed and supported thereon was prepared in the same manner as in the preparation of the sample 1, and then, dispensing and drying of nanocrystals were further performed once, to prepare a sample 2.

(2) Fabrication of Light Emitting Diode

Figure 8:
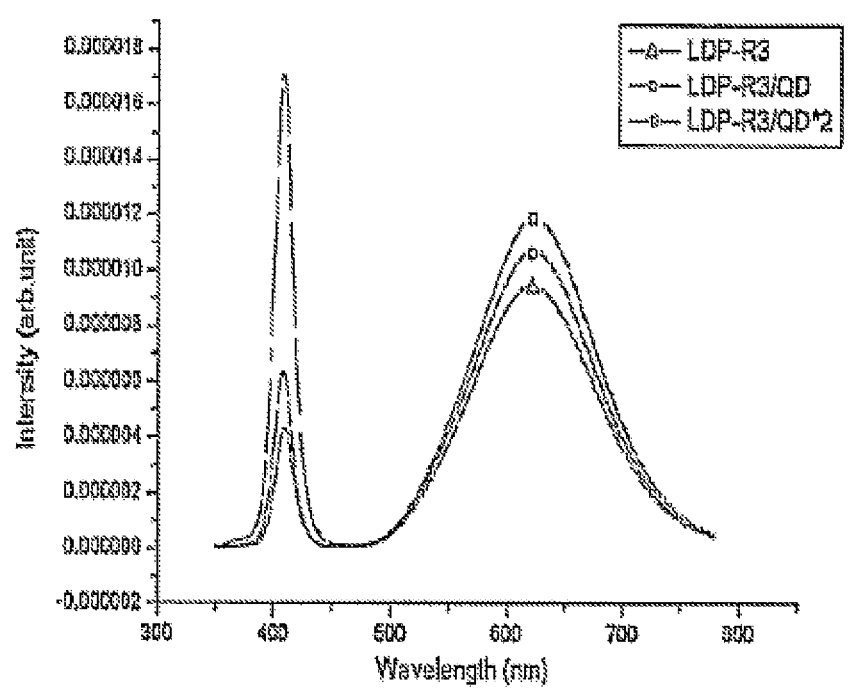
FIG. 8 is a light emitting spectrum of the light emitting diode using the quantum dot phosphor manufactured in Example 3 of the present invention.

LDP-R3 inorganic phosphor, and the samples 1 and 2 were each mixed with 2 g of a solution of an epoxy resin and a curing agent mixed at a weight ratio of 1:1, to prepare a mixture of a phosphor and an epoxy resin. The mixture was dispensed on a chip emitting a UV light source of 400 nm, and then cured in an oven at 120° C. for 1 hr. To package the first dispensed and cured mixture to a lamp, a solution of an epoxy resin and a curing agent mixed at a weight ratio of 1:1 was loaded into a mold, into which the chip, having undergone first dispensing, was dipped and then cured again in an oven at 120° C. After about 2 hr, the chip was removed from the oven, and subsequently, the mold was removed from the chip, to obtain a light emitting diode using an LDP-R3 phosphor without CdSe/CdS nanocrystals, and light emitting diodes using phosphors with different loading amounts of nanocrystals. When current of about 20 mA was applied to each diode thus manufactured, all the diodes emitted orange light. Further, each diode was loaded into an integrating sphere, and then measured for light emitting efficiency, which was found to be about 3.5% for LDP-R3, about 4.0% for the sample 1 comprising the nanocrystals dispersed once on LDP-R3, and about 4.5% for the sample 2 comprising the nanocrystals dispersed twice on LDP-R3. The light emitting spectrum is depicted in FIG. 8.

As described hereinbefore, the present invention provides a quantum dot phosphor for light emitting diodes and a method of preparing the quantum dot phosphor. In the quantum dot phosphor of the present invention, the quantum dots are supported on a solid substrate. Thus, when such quantum dots are mixed with the paste resin for use in manufacturing a light emitting diode, they do not aggregate with each other. Thereby, a light emitting diode having excellent light emitting efficiency can be obtained. Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A quantum dot phosphor, comprising:
    quantum dots; and
    a solid substrate on which the quantum dots are supported,
    wherein the quantum dots are disposed directly on an outer surface defining the solid substrate, each of the quantum dots being separated from the remaining quantum dots;
    wherein the solid substrate comprises an inorganic phosphor;
    wherein the quantum dot is a Group II-VI compound semiconductor nanocrystal or a mixture of the Group II-VI compound semiconductor nanocrystals, or is a Group III-V compound semiconductor nanocrystal or a mixture of the Group III-V compound semiconductor nanocrystals; and
    wherein the Group II-VI compound semiconductor nanocrystal is selected from CdS, CdSe, CdTe, ZnS, ZnSe, ZnTe, HgS, HgSe, and HgTe, and the Group III-V compound semiconductor nanocrystal is selected from GaN, GaP, GaAs, AlN, AlP, AlAs, InN, InP, and InAs.

2. The quantum dot phosphor of claim 1, wherein the mixture of the Group II-VI compound semiconductor nanocrystals is selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHg-SeTe, CdHgSTe, HgZnSeS, HgZnSeTe and HgZnSTe, and the mixture of the Group III-V compound semiconductor nanocrystals is selected from GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs and InAlPAs.

3. The quantum dot phosphor of claim 2, wherein the mixture is present in a form of a partially different crystalline structure, or is present in a form of an alloy.

4. The quantum dot phosphor of claim 1, wherein the quantum dots are prepared by solution synthesis.

5. The quantum dot phosphor of claim 1, wherein the inorganic phosphor is selected from the group consisting of ZnS:Ag, ZnS:Cu, ZnS:Mn, ZnS:Cu,Al, (Zn,Cd)S:Cu, (Zn,Cd)S:Ag, (Zn,Cd)S:Cu,Al, ZnS :Cu,Au,Al, ZnS:Ag,Cu,Ga,Cl, $Y_2O_2S$:Eu, ZnS :Ag,Al, ZnO:Zn, $BaMgAl_{10}O_{17}$:Eu2+, $(Sr,Ca,Ba,Mg)_{10}(PO_4)_6Cl_2$:Eu, $Sr_{10}(PO_4)_6Cl_2$:Eu, $(Ba,Sr,Eu)(Mg, Mn)Al_{10}O_{17}$, $(Ba, Eu)MgAl_{10}O_{17}$, $YVO_4$:Eu, and mixtures thereof.

6. The quantum dot phosphor of claim 1, wherein the quantum dots are present only on the outer surface of the solid substrate.

7. The quantum dot phosphor of claim 1, wherein the quantum dots surround the outer surface of the solid substrate.

8. The quantum dot phosphor of claim 1, wherein the solid substrate is equal to or less than about 100 micrometers in diameter.

9. A quantum dot phosphor comprising:
a plurality of solid substrates, wherein the plurality of solid substrates comprise an inorganic phosphor, and wherein each solid substrate of the plurality of solid substrates includes an outer surface; and
a plurality of quantum dots disposed on the outer surface of each solid substrate of the plurality of solid substrates, each of the plurality of quantum dots being separated from the remaining quantum dots, wherein the quantum dot is a Group II-VI compound semiconductor nanocrystal or a mixture of the Group II-VI compound semiconductor nanocrystals, or is a Group III-V compound semiconductor nanocrystal or a mixture of the Group III-V compound semiconductor nanocrystals, and wherein the Group II-VI compound semiconductor nanocrystal is selected from CdS, CdSe, CdTe, ZnS, ZnSe, ZnTe, HgS, HgSe, and HgTe, and the Group III-V compound semiconductor nanocrystal is selected from GaN, GaP, GaAs, AlN, AlP, AlAs, InN, InP, and InAs.

10. The quantum dot phosphor of claim 9, wherein the solid substrate is equal to or less than about 100 micrometers in diameter.

* * * * *